(12) United States Patent
Kim et al.

(10) Patent No.: US 7,997,749 B2
(45) Date of Patent: Aug. 16, 2011

(54) LIGHT EMITTING MODULE AND LIGHT UNIT HAVING THE SAME

(75) Inventors: Kyung Jun Kim, Hwaseong-si (KR); Chul Ho Park, Uijeongbu-si (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/644,880

(22) Filed: Dec. 22, 2009

(65) Prior Publication Data

US 2010/0220463 A1 Sep. 2, 2010

(30) Foreign Application Priority Data

Mar. 2, 2009 (KR) .................. 10-2009-0017733

(51) Int. Cl.
F21V 33/00 (2006.01)

(52) U.S. Cl. .................. 362/97.3; 362/249.02; 362/800

(58) Field of Classification Search ............. 362/249.02, 362/800, 97.1, 97.3
See application file for complete search history.

(56) References Cited

U.S. PATENT DOCUMENTS

| 6,428,189 | B1* | 8/2002 | Hochstein | 362/373 |
| 7,441,925 | B2* | 10/2008 | Chou et al. | 362/294 |
| 7,524,080 | B2* | 4/2009 | Tu et al. | 362/183 |
| 2005/0280017 | A1 | 12/2005 | Oshio et al. | |
| 2007/0090737 | A1* | 4/2007 | Hu et al. | 313/11 |
| 2007/0153511 | A1* | 7/2007 | Chou | 362/227 |
| 2008/0106898 | A1 | 5/2008 | Park et al. | |
| 2008/0170415 | A1 | 7/2008 | Han et al. | |
| 2009/0268434 | A1* | 10/2009 | Mita et al. | 362/97.1 |
| 2009/0296394 | A1* | 12/2009 | Wang | 362/249.02 |

FOREIGN PATENT DOCUMENTS

| JP | 2008-129464 A | 6/2008 |
| KR | 10-2006-0030350 A | 4/2006 |
| WO | WO 2009/011292 A1 | 1/2009 |

* cited by examiner

Primary Examiner — Laura Tso
(74) Attorney, Agent, or Firm — Birch, Stewart, Kolasch & Birch, LLP

(57) ABSTRACT

Disclosed are a light emitting module and a light unit having the same. The light emitting module includes a plurality of light emitting devices, each light emitting device including a package body, a light emitting diode provided in the package body, and a plurality of lead electrodes electrically connected to the light emitting diode while protruding outwardly from the package body; and a board including at least one receiving groove, wherein the at least one of the light emitting devices is removably inserted into the at least one receiving groove.

25 Claims, 8 Drawing Sheets

US 7,997,749 B2

LIGHT EMITTING MODULE AND LIGHT UNIT HAVING THE SAME

CROSS-REFERENCE TO RELATED APPLICATIONS

The present application claims priority under 35 U.S.C. 119 to Korean Patent Application No. 10-2009-0017733 filed on Mar. 2, 2009, which is hereby incorporated by reference in its entirety.

BACKGROUND OF THE INVENTION

1. Field of the Invention

Embodiments of the invention relate to a light emitting module and a light unit having the same.

2. Discussion of the Related Art

A liquid crystal display (LCD) has been used for various electronic devices such as a computer monitor, a television, a mobile communication terminal, and a navigation device.

Since the LCD is a non-emissive device, the LCD is provided at a rear surface thereof with a backlight unit supplying light to the LCD.

Recently, a light emitting diode (LED) has been mainly used as a light source for the backlight unit instead of a cold cathode fluorescent lamp.

The LED is used as a light source in various devices requiring light as well as the backlight unit of the LCD.

SUMMARY OF THE INVENTION

The embodiments of the invention provide a light emitting module including light emitting devices arranged in a receiving groove of a board and a light unit having the same.

The embodiments of the invention provide a light emitting module and a light unit having the same, in which the interval between light emitting devices of the board and the number of the light emitting devices can be adjusted.

An embodiment of the invention provides a light emitting module including a plurality of light emitting devices, each light emitting device including a package body, a light emitting diode provided in the package body, and a plurality of lead electrodes electrically connected to the light emitting diode while protruding outwardly from the package body; and a board including at least one receiving groove, wherein the at least one of the light emitting devices is removably inserted into the at least one receiving groove.

An embodiment provides a light unit including a plurality of light emitting devices, each light emitting device including a package body, a light emitting diode provided in the package body, and a plurality of lead electrodes electrically connected to the light emitting diode while protruding outwardly from the package body; a board including at least one receiving groove, wherein the at least one receiving groove receives the plurality of lead electrodes of the each light emitting device; and an optical member provided at one side of the plurality of light emitting devices.

BRIEF DESCRIPTION OF THE DRAWINGS

The accompanying drawings, which are included to provide a further understanding of the invention and are incorporated in and constitute apart of this specification, illustrate embodiments of the invention and together with the description serve to explain the principles of the invention. In the drawings.

DETAILED DESCRIPTION OF THE EMBODIMENTS

Figure 1:
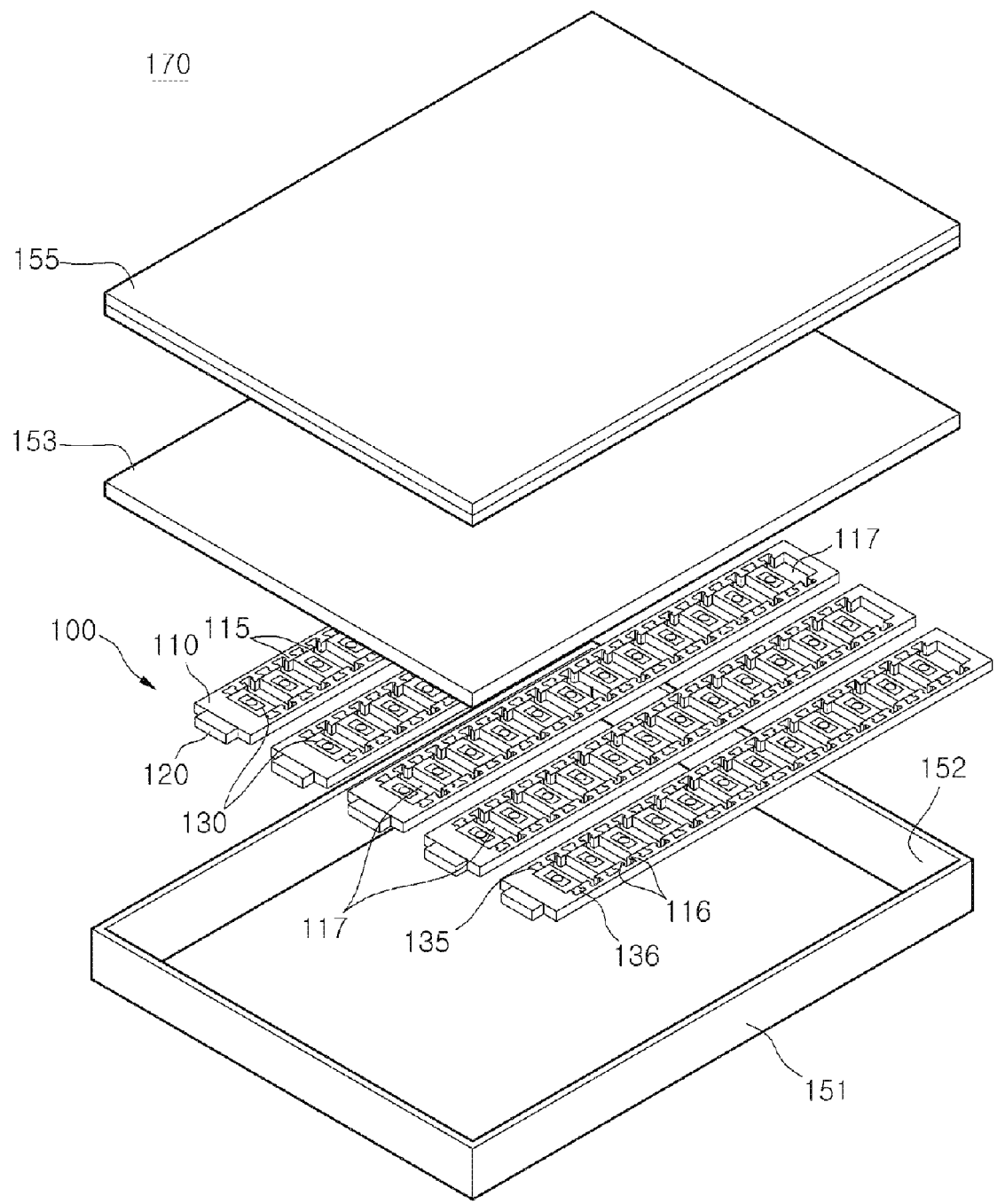
FIG. 1 is a perspective view showing a display apparatus according to a first embodiment of the invention.

In the description of embodiments of the invention, it will be understood that when a layer (or film) is referred to as being 'on' another layer or board, it may be directly on another layer or board, or intervening layers may also be present. Further, it will be understood that when a layer is referred to as being 'under' another layer, it may be directly under another layer, and one or more intervening layers may also be present. In addition, it will also be understood that when a layer is referred to as being 'between' two layers, it may be the only layer between the two layers, or one or more intervening layers may also be present.

In the following description, the sizes of elements discussed or shown are for the purpose of clear explanation, and the actual sizes of the elements may be different from the size of elements shown in the drawings. Upper and lower portions of each element will be described below with reference to accompanying drawings. Technical features of each embodiment of the invention are not limited to the embodiment discussed, and may be selectively adapted to another embodiment of the invention.

Hereinafter, example embodiments of the present invention will be described with reference to accompanying drawings.

Figure 2:
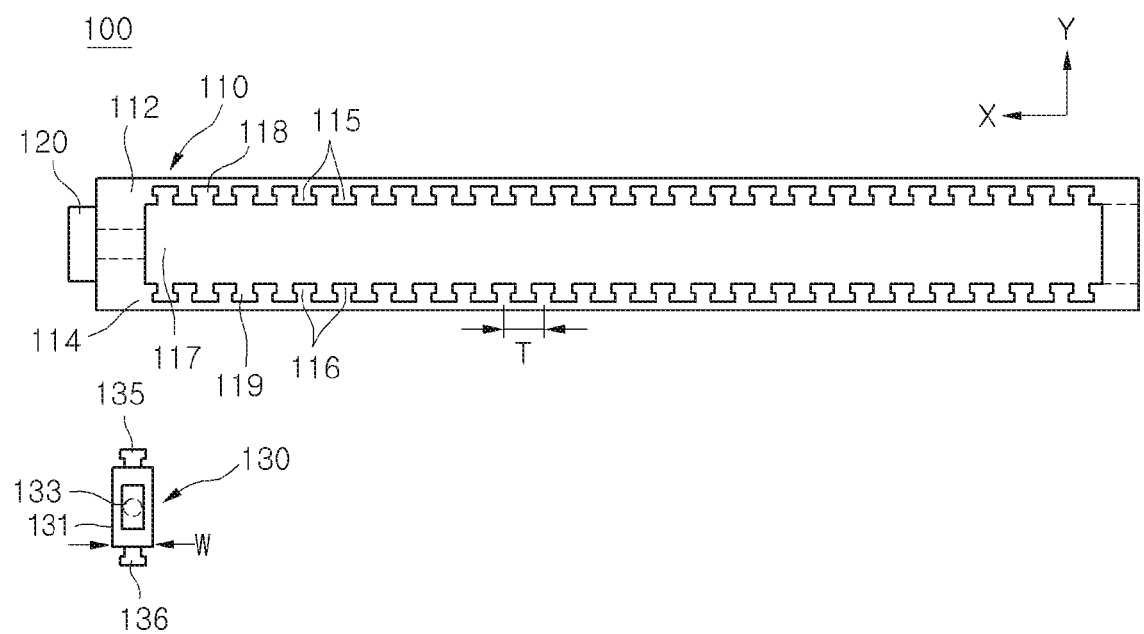
FIG. 2 is a view showing a light emitting module of FIG. 1.
Figure 3:
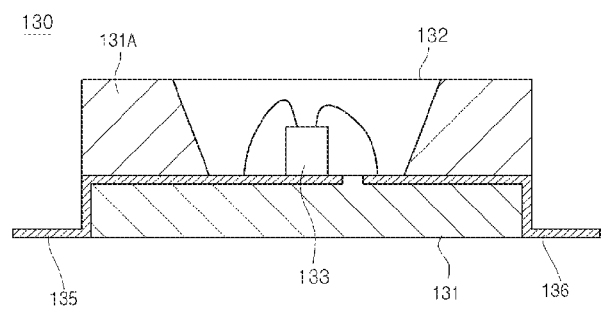
FIG. 3 is a side sectional view showing a light emitting device of FIG. 2.

FIG. 1 is a perspective view showing a display apparatus according to a first embodiment of the invention, and FIG. 2 is a plan view showing a light emitting module of FIG. 1. FIG. 3 is a side sectional view showing a light emitting device of FIG. 2.

Referring to FIG. 1, a display apparatus 170 includes a light emitting module 100, a bottom cover 151, an optical member 153, and a display panel 155. The bottom cover 151, the light emitting module 100, and the optical member 153 may serve as a light unit.

The bottom cover 151 has sidewalls 152, and a recess having a predetermined depth is defined by the sidewalls 152. The sidewalls 152 may be perpendicular to a bottom surface of the bottom cover 151 or inclined to the bottom surface. An outer side of the bottom cover 151 may be formed as a separate structure, but the embodiment is not limited thereto.

The bottom cover 151 includes aluminum (Al), magnesium (Mg) zinc (Zn), titanium (Ti), tantalum (Ta), hafnium (Hf), niobium (Nb), or the alloy thereof, but the embodiment is not limited thereto.

At least one light emitting module 100 is provided in the bottom cover 151. The light emitting module 100 includes a board 110 and a light emitting device 130. The bottom cover 151 sinks heat radiated from the light emitting device 130 of the light emitting module 100.

The board 110 may be made of various materials or have various types like a flexible printed circuit board (FPCB), a metal core PCB (MCPCB), an FR-4 board, a CEM-3 board, or a PCB, but the embodiment is not limited thereto. The board 110 may have a bar structure or a branch structure.

A plurality of light emitting devices 130 are fitted into the board 110. The board 110 is provided therein with at least one receiving groove 117, and the receiving groove 117 may be configured in the form of holes or recesses in the board 110.

The receiving groove 117 is formed in a first direction (e.g., longitudinal direction) of the board 110, and lead parts are arranged along the receiving groove 117. A plurality of receiving grooves 117 may communicate with each other to receive the light emitting devices 130.

The light emitting devices 130 may be uniformly or irregularly arrayed in the receiving groove 117. The pitch between the light emitting devices 130 may be adjusted. The light emitting devices 130 are fitted into both sides of the receiving groove 117.

The light emitting devices 130 are received in the receiving groove 117, and electrically connected to a circuit pattern of the board 110.

The receiving groove 117 is provided at one side thereof with a plurality of first holders 115 and at the other side thereof with a plurality of second holders 116. The first and second holders 115 and 116 are coupled with the light emitting devices 130 while supporting the light emitting devices 130.

The receiving groove 117 has a plurality of spaces such that the light emitting devices 130 may be selectively fitted into the spaces of the receiving groove 117.

The light emitting devices 130 may be connected to each other in parallel. Such a circuit structure may have a parallel structure or a series structure depending on the circuit pattern of the board 110, and the forward or reverse arrangement of the light emitting devices 130.

The optical member 153 is provided over the light emitting module 100 to optically guide, refract, diffuse, or reflect light emitted from the light emitting module 100 to the display panel 155.

The optical member 153 includes at least one optical sheet or at least one kind of optical sheet. The optical member 153 may selectively include a diffusion sheet, a prism sheet, a brightness enhancement film or a protective sheet. The diffusion sheet diffuses incident light, and the vertical or horizontal prism sheet condenses incident light on a display area. The brightness enhancement film repeatedly reflects light to enhance the brightness of the light.

The optical member 153 may include a light guide plate to output light that has been input from the light emitting module 100, as surface light.

The display panel 155 is provided over the optical member 153. The display panel 155 may be realized by using a liquid crystal panel. The display panel 155 displays information based on light irradiated from the light emitting module 100.

According to the embodiment, the pitch between the light emitting devices 130 on the board 110 may be adjusted. According to the embodiment, the brightness uniformity and/or unevenness or inconsistency characteristic of the light emitting module 100 may be adjusted by particular placements of the light emitting devices 130 in the light emitting module 100. According to the embodiment, brightness uniformity in a specific area may be adjusted by adjusting the interval and the number of the light emitting devices 130.

According to the embodiment, the light emitting module 100 may be conveniently assembled.

Referring to FIGS. 1 and 2, the board 100 includes the receiving groove 117, a first lead part 112, a second lead part 114, first holders 115, second holders 116, first coupling parts 118, and second coupling parts 119.

The board 110 is provided therein with the receiving groove 117, and provided with the first and second lead parts 112 and 114 to drive the light emitting devices 130. The first and second lead parts 112 and 114 are insulated from each other by an insulating material.

The receiving groove 117 may be configured in the form of a recess or a hole in a first direction (X) or a longitudinal direction of the first board 110. Both sides of the receiving groove 117 face each other about the first direction, and concave and convex sections are formed at both sides of the receiving groove 117.

The first holders 115 alternate with the first coupling parts 118 at one side of the receiving groove 117. The second holders 116 alternate with the second coupling parts 119 at the other side of the receiving groove 117. The first holders 115 and the second holders 116 have convex sections protruding toward the receiving groove 117. The first coupling parts 118 have the concave section between the first holders 115, and the second coupling parts 119 have the convex section between the second holders 116.

The concave and convex sections of the first coupling parts 118 and the first holders 115 are repeated with a predetermined period, and the concave and convex sections of the second coupling parts 119 and the second holders 116 are repeated with the predetermined period. One period T may be identical to a width of the light emitting device 130, but is not limited thereto.

The concave section and the convex section may have a hemispherical shape or a polygonal shape. The concave section may have a step shape having a narrow entrance and a wide internal space. The shape of the convex section may be changed by the shape of the concave section. The shapes of the concave and convex sections may be modified in the technical scope of the embodiment.

The light emitting devices 130 may be received in the receiving groove 117. The light emitting devices 130 are inserted into the receiving groove 117, and electrically connected to the board 110. In embodiments, the light emitting devices 130 are removably inserted into the receiving groove 117 so that the light emitting devices 130 may be rearranged in the receiving groove 117 if desired. Removably inserted also refers to a state of attachment that is reversible with ease and/or without damage. That is, when the light emitting devices 130 are removably inserted into the receiving groove 117, the light emitting devices 130 are detacheable with ease or without damage.

In each light emitting device 130, a package body 131 is provided therein with a light emitting diode 133 and provided at both sides thereof with first and second lead electrodes 135 and 136.

The light emitting device 130 is received in the receiving groove 117, and ends of the light emitting device 130 are coupled with the first and second coupling parts 118 and 119, respectively. The first and second holders 115 and 116 support respective ends of the light emitting device 130. The first lead electrode 135 of the light emitting device 130 is electrically connected to the first lead part 112 through the first coupling part 118 and the first holder 115. The second lead electrode 136 is electrically connected to the second lead part 114 through the second coupling part 119 and the second holder 116.

The pitch between the light emitting devices 130 may be adjusted in the space of the receiving groove 117. For example, the pitch between the light emitting devices 130 may be freely adjusted in the receiving groove 117 by arranging continuously or discretely the light emitting devices 130 along the receiving groove 117.

The light emitting devices 130 may be assembled with the first and second holders 115 and 116 and the first and second coupling parts 118 and 119 through an assembly scheme, a hook scheme, or a locking scheme. The light emitting devices 130 may be electrically connected with the first and second holders 115 and 116 and the first and second coupling parts 118 and 119 through surface contact.

The light emitting devices 130 may be mounted on the first and second holders 115 and 116 and the first and second coupling parts 118 and 119 through a surface mount technology (SMT).

The light emitting devices 130 may be positioned under a top surface of the board 110 or protrude from the top surface of the board 110, but the embodiment is not limited thereto.

The light emitting device 130 is electrically connected to the first and second lead parts 112 and 114 on the top surface and/or a bottom surface of the board 110 by using a conductive tape or a conductive adhesive. A heat sink may be provided under the receiving groove 117 of the board 110, but the embodiment is not limited thereto.

A connector 120 is coupled with at least one side of the board 110. The connector 120 is connected to the first and second lead parts 112 and 114.

In the light emitting module 100 shown in FIG. 1, the same kind or different kinds of the light emitting devices 130 may be arranged on the board 110. If a dimming circuit to control three-color LEDs is employed, a contrast ratio may be improved, and power consumption may be reduced.

FIG. 3 is a side sectional view showing the light emitting device of FIG. 2. Referring to FIG. 3, the light emitting device 130 includes the package body 131, the light emitting diode 133, an upper body 131A, the first lead electrode 135, and the second lead electrode 135.

The light emitting device 130 is a package including at least one light emitting diode 133, and may emit color lights such as a blue light, a green light, or a red light, or may emit a white light. The above light may be emitted from the light emitting diode 133. The light may be emitted with various colors according to the combination of the light emitting diodes 133 or the combination of the light emitting diodes 133 and phosphor substances. The light having various colors may be employed in the technical scope of the embodiment.

The package body 131 includes the upper body 131 having a cavity 132 with a predetermined depth. The upper body 131A may be made of a material that is the same as or different from that of the package body 131. The upper body 131A need not be present so that the light emitting diodes 133 are attached to the package body 131 without the cavity 132. A lens may be attached onto the package body 131. The lens may adjust light orientation distribution.

The package body 131 may be injection-molded by selectively using high-reflection resin (e.g., PPA), polymer, silicon, and plastic. The package body 131 may have a single layer structure or a multi-layer structure. The cavity may be a concave base tube shape-groove, a circular shape-groove, or a polygonal shape-groove formed at an upper portion of the package body 131, but the embodiment is not limited thereto.

At least one light emitting diode 133 is electrically connected to the first and second lead electrodes 135 and 136 in the cavity 132. The connection scheme may be a wire-bonding scheme, a flip-bonding scheme or a die-bonding scheme, but is not limited thereto.

The light emitting diode 133 may include at least one or plural chips among color LED chips such as a red LED chip, a green LED chip, a blue LED chip and UV LED chips. A resin member is formed in the cavity 132. The resin member may be formed by using silicon or an epoxy. The resin member may include at least one kind of color phosphor substances such as a red phosphor substance, a blue phosphor substance, and a green phosphor substance. A lens may be attached onto the resin member or the lens may be transfer molded onto the resin member, but the embodiment is not limited thereto.

One end of the respective first lead electrode 135 and the second lead electrode 136 is provided in the cavity 132, and the other end of the respective first and second lead electrodes 135 and 136 extends from an inside of the package body 131 to an outside of the package body 131.

The first and second lead electrodes 135 and 136 may include one of a PCB lead frame, a ceramic lead frame, and a plated metal plate.

The other end of the first and second lead electrodes 135 and 136 may protrude outwardly from the package body 131 or may be bent toward a rear surface of the package body 131. The thickness of the first and second lead electrodes 135 and 136 or the shape of the package body 131 may be modified in order to enhance a heat sink efficiency.

Figure 4:
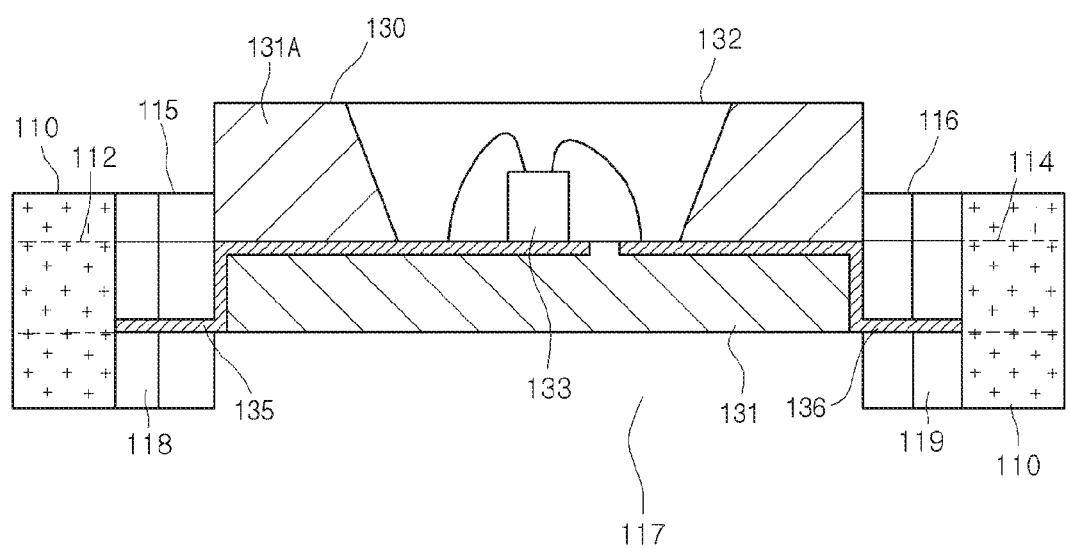
FIG. 4 is a side sectional view showing the light emitting module of FIG. 1.

FIG. 4 is a side sectional view showing the assembly of the light emitting device. Referring to FIG. 4, the first and second lead parts 112 and 114 are formed in the board 110. The first lead part 112 is exposed to the first coupling part 118, and the second lead part 114 is exposed to the second coupling part 119. The first and second lead parts 112 and 114 may be arranged on the top surface and/or the bottom surface of the board 110, and such an arrangement may be modified according to a circuit pattern and the type of the board 110.

The light emitting device 130 is inserted into the receiving groove 117 of the board 110, and the first lead electrode 135 is coupled with the first coupling part 118 so that the first lead electrode 135 is electrically connected to the first lead part 112. The second lead electrode 136 is coupled with the second coupling part 119 so that the second lead electrode 136 is electrically connected to the second lead part 114. Accordingly, the light emitting device 130 may be electrically connected to the board 110.

Figure 5:
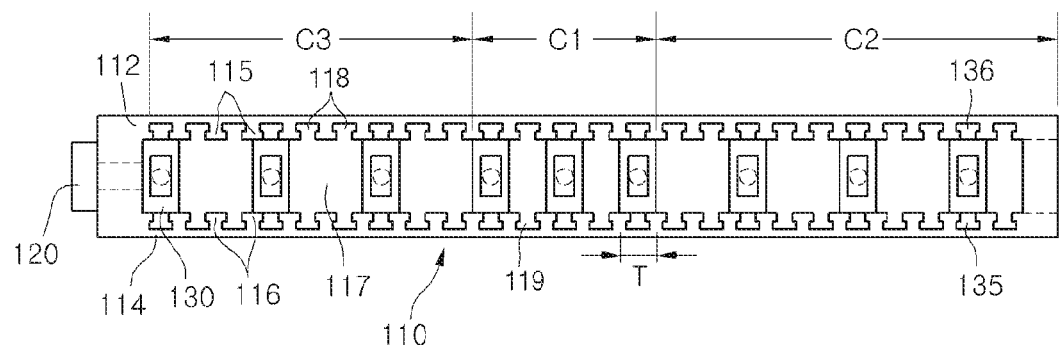
FIG. 5 is a plan view showing a light emitting module according to a second embodiment.

FIG. 5 is a view showing a light emitting module according to the second embodiment. In the following description, details of elements identical to those of the first embodiment will be omitted in order to avoid redundancy.

Referring to FIG. 5, in the light emitting module 100A, the light emitting devices 130 are arranged with a narrower period in a central section C1 than in side sections C2 and C3.

The light emitting devices 130 are arranged with a gap of one period T in the central section C1 of the board 110, and arranged with a gap of two periods (2*T) in both side sections C2 and C3. The distance of the period T may correspond to the width of one light emitting device 130 or one period of a concave-convex pattern, but the embodiment is not limited thereto. The period T may have various values according to the size of the display panel 155 and the width of the light emitting device 130.

According to the second embodiment, more light emitting devices 130 are arranged in the central section C1, so that the brightness of the central section C1 can be improved.

Figure 6:
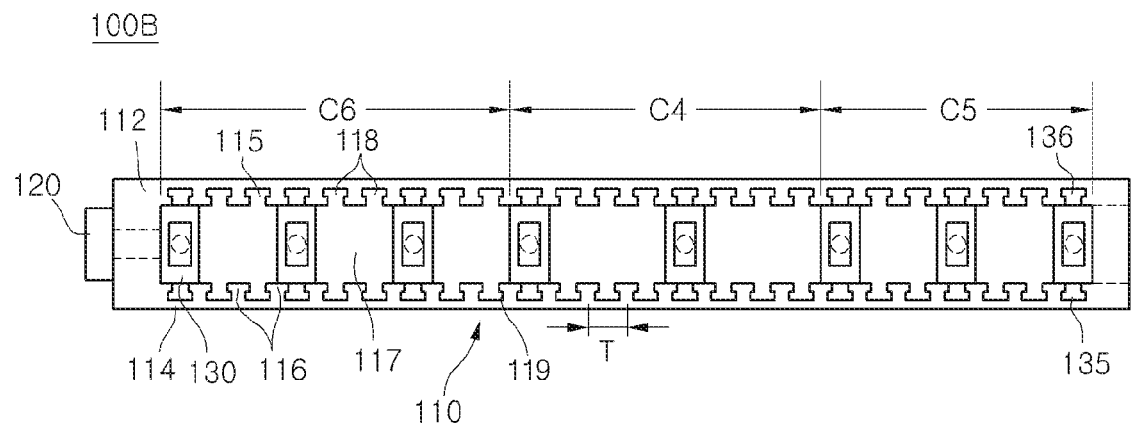
FIG. 6 is a plan view showing a light emitting module according to a third embodiment.

FIG. 6 is a view showing a light emitting module according to a third embodiment. In the following description, details of elements identical to those of the first embodiment will be omitted in order to avoid redundancy.

Referring to FIG. 6, in the light emitting module 100B, the light emitting devices 130 are arranged with a wider period in a central section C4 than in side sections C5 and C6.

The light emitting devices 130 may be arranged with gaps of three periods 3T in the central section C4, and arranged with gaps of two periods 2T in the both side sections C5 and C6. More light emitting devices 130 are arranged in the side sections C5 and C6, so that uniform edge brightness distribution can be obtained in the side sections C5 and C6.

As shown in FIGS. 5 and 6, the light emitting devices 130 may be arranged continuously, or with gaps of at least one period in the receiving groove 117. The light emitting devices 130 may be arranged with a different period in each section. The arrangement period of the light emitting devices 130 may be varied in the technical scope of the embodiment.

According to the embodiment, receiving grooves 117 may be formed in one row or two rows in the board 110 and the number of the rows may be varied according to the size of the board 110.

Figure 7:
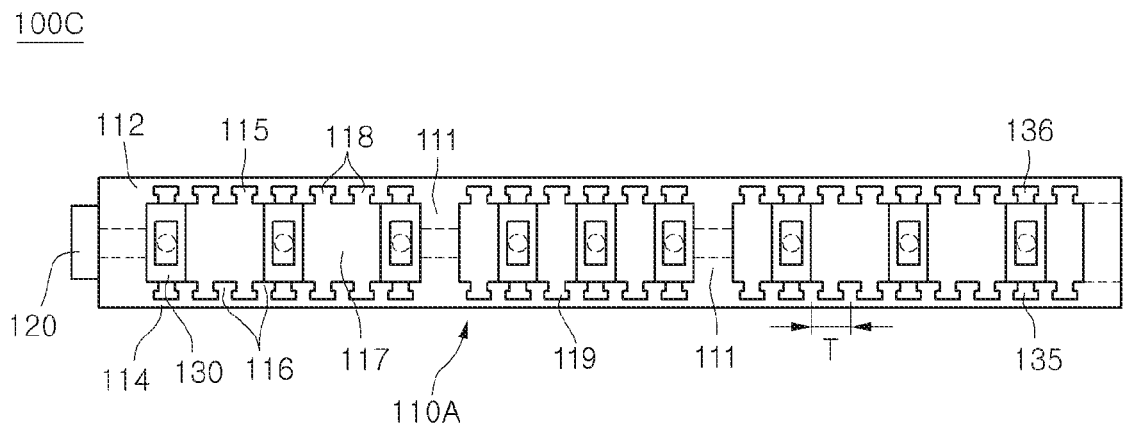
FIG. 7 is plan view showing a light emitting module according to a fourth embodiment.

FIG. 7 is a view showing a light emitting module according to a fourth embodiment. In the following description, details of elements identical to those of the first embodiment will be omitted in order to avoid redundancy.

Referring to FIG. 7, the light emitting module 100C is provided in a board 110A thereof with an intermediate supporting part 111 to reduce or prevent the board 110A from being bent. Since each section of the receiving groove 117, or the board 110A divided by the intermediate supporting part 111 has a different circuit connection structure, the driving of the light emitting device 130 can be independently controlled in each section.

Figure 8:
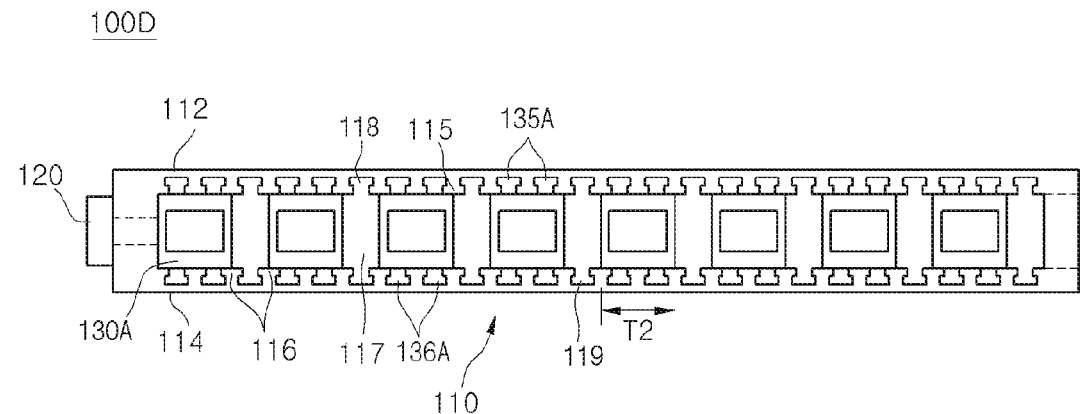
FIG. 8 is a plan view showing a light emitting module according to a fifth embodiment.

FIG. 8 is a view showing a light emitting module according to a fifth embodiment. In the following description, details of elements identical to those of the first embodiment will be omitted in order to avoid redundancy.

Referring to FIG. 8, the light emitting module 100D is provided in the board 110A thereof with light emitting devices 130A having a large area. The light emitting devices 130A have a width corresponding to two periods 2T, and are arranged along the receiving groove 117.

A plurality of first lead electrodes 135A are formed at one side of the light emitting device 130A, and a plurality of second lead electrodes 136A are formed at the other side of the light emitting device 130A. The first lead electrodes 135A of the light emitting device 130A are coupled with the first coupling parts 118, and the second lead electrodes 136A are coupled with the second coupling parts 119.

Figure 9:
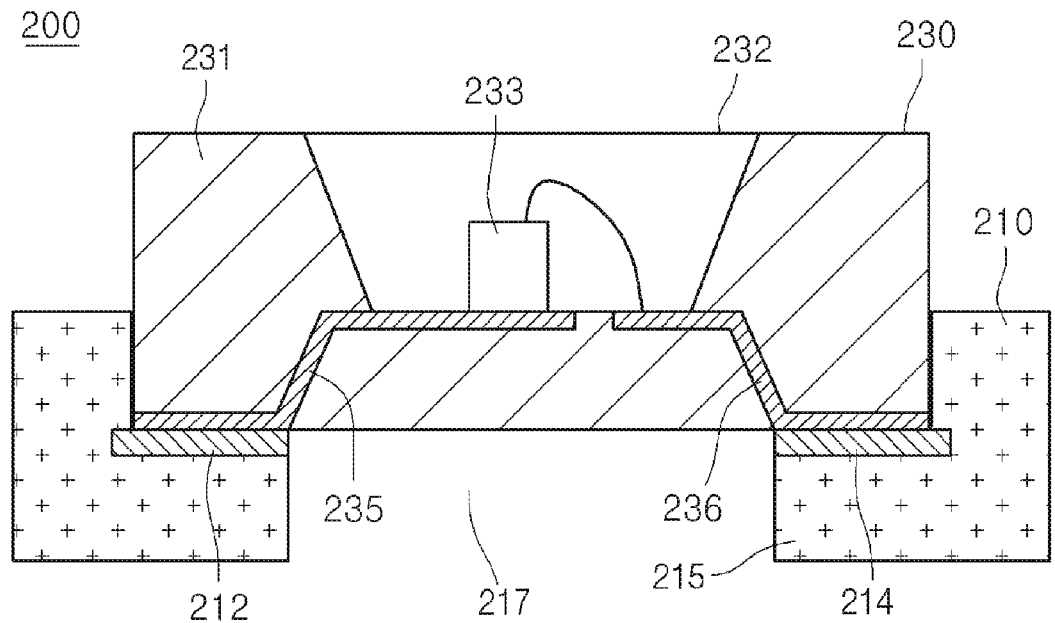
FIGS. 9 to 15 are views the assembly of a light emitting device and a board.

FIGS. 9 to 15 are views showing various light emitting modules. Referring to FIG. 9, a light emitting module 200 is provided on a board 210 thereof with a plurality of light emitting devices 230. A supporting part 215 protrudes inwardly in a receiving groove 217 of the board 210 while making contact with a bottom surface of the light emitting device 230. Lead electrodes 235 and 236 of the light emitting device 230 are electrically connected to a light emitting diode 233 provided in a cavity 232 of a package body 231. The lead electrodes 235 and 236 extend to a bottom surface of the package body 231 through a via-structure. The package body 231 has a protrusion structure in which the package body 231 is coupled with both sides of the receiving groove 217.

The lead electrodes 235 and 236 of the light emitting device 230 make contact with top surfaces of lead parts 212 and 214 of the board 210, and the lead electrodes 235 and 236 may be mounted on the board 210 through an adhering scheme or a bonding scheme.

Figure 10:
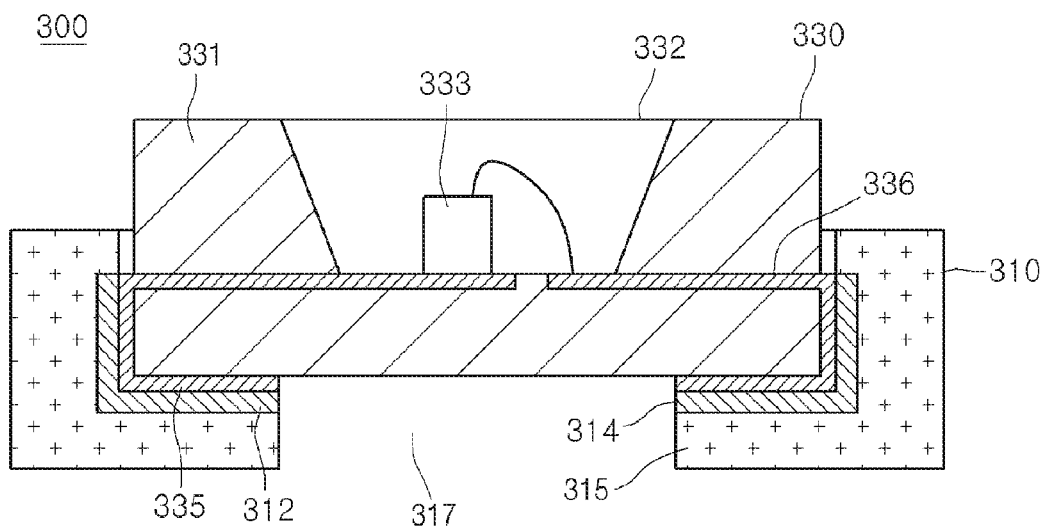

Referring to FIG. 10, a light emitting module 300 is provided on a board 310 thereof with a plurality of light emitting devices 330. A supporting part 315 is formed in a receiving groove 317 of the board 310 while making contact with an outer portion of a bottom surface of the light emitting device 330. Lead electrodes 335 and 336 of the light emitting device 330 are electrically connected to a light emitting diode 333 provided in a cavity 332 of a package body 331. The lead electrodes 335 and 336 extend to a bottom surface of the package body 331 along an outer lateral side of the package body 331.

The lead electrodes 335 and 336 of the light emitting device 330 make contact with top surfaces of lead parts 312 and 314 of the board 310, and the lead electrodes 335 and 336 may be mounted on the board 310 through an adhering scheme or a bonding scheme.

Figure 11:
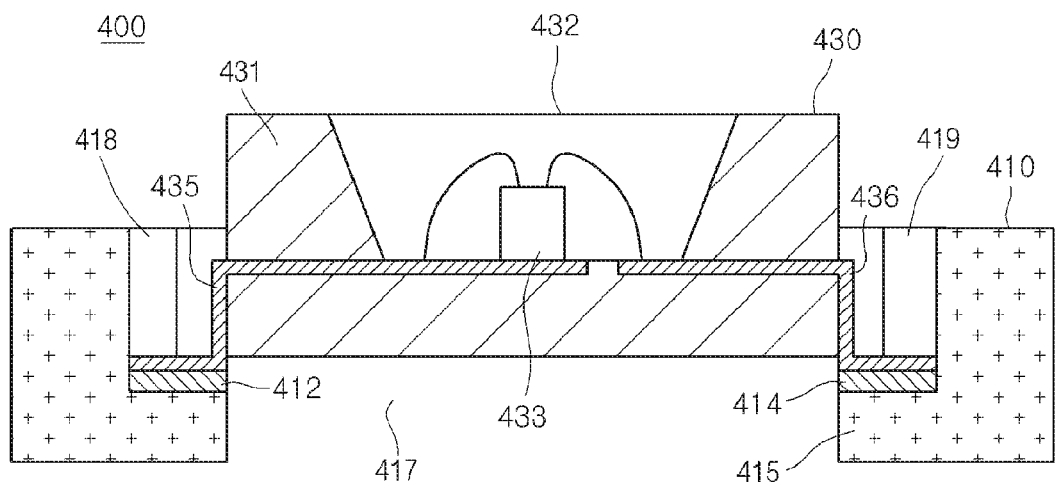

Referring to FIG. 11, a light emitting module 400 is provided on a board 410 thereof with a plurality of light emitting devices 430. Supporting parts 415 are formed in a receiving groove 417 of the board 410. The supporting parts 415 are formed under first and second coupling parts 418 and 419 of the board 410. First and second lead parts 412 and 414 are formed on top surfaces of the supporting parts 415.

Lead electrodes 435 and 436 of the light emitting device 430 are electrically connected to a light emitting diode 433 provided in a cavity 432 of a package body 431. The lead electrodes 435 and 436 extend outward along an outer lateral side of the package body 431.

The lead electrodes 435 and 436 of the light emitting device 430 make contact with top surfaces of lead parts 412 and 414 of the board 410, and the lead electrodes 435 and 436 may be mounted on the board 410 through an adhering scheme or a bonding scheme.

Figure 12:
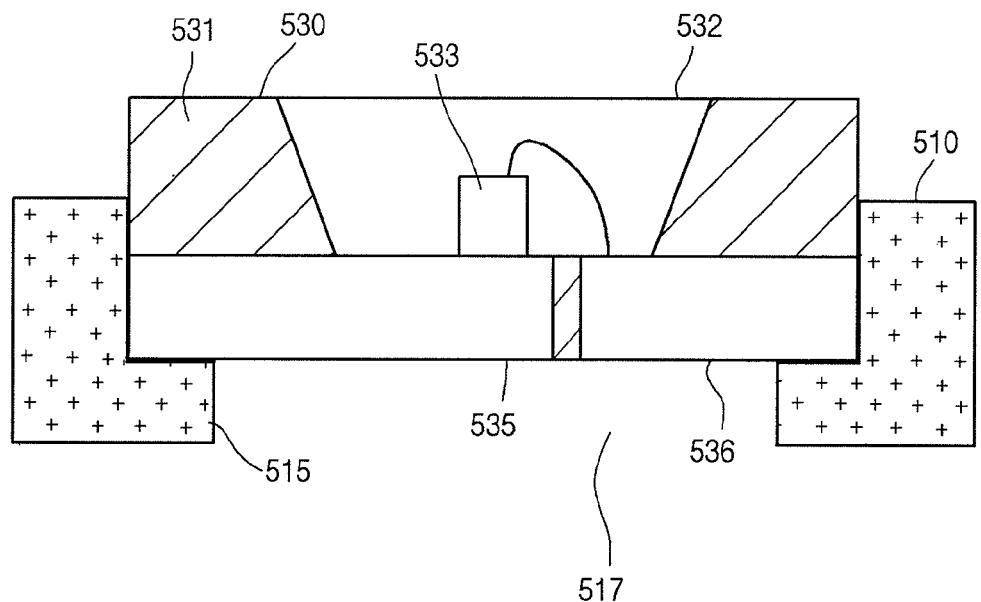

Referring to FIG. 12, a light emitting module 500 is provided on a board 510 thereof with a plurality of light emitting devices 530. A supporting part 515 is formed at an outer lower portion of a receiving groove 517 of the board 510. A lead part may be arranged in the supporting part 515.

Lead electrodes 535 and 536 of the light emitting device 530 are electrically connected to a light emitting diode 533 provided in a cavity 532 of a package body 531, and form a lower portion of the package body 531. Such a package structure can improve a heat sink efficiency.

The lead electrodes 535 and 536 make contact with top surfaces of lead parts of the board 510, and the lead electrodes 535 and 536 may be mounted on the board 510 through an adhering scheme or a bonding scheme.

Figure 13:
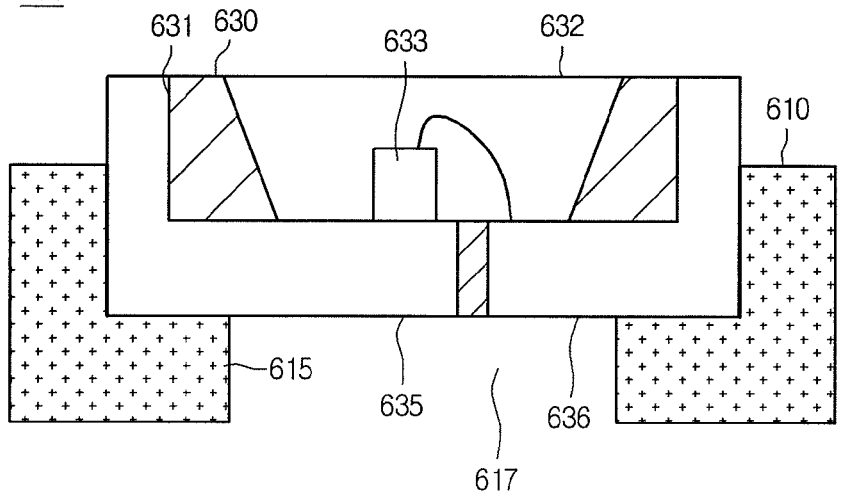

Referring to FIG. 13, a light emitting module 600 is provided on a board 610 thereof with a plurality of light emitting devices 630. A supporting part 615 is formed at an outer lower portion of a receiving groove 617 of the board 610. A lead part may be arranged in the supporting part 615.

Lead electrodes 635 and 636 of the light emitting device 630 are electrically connected to a light emitting diode 633 provided in a cavity 632 of a package body 631, and form a lower portion and an outer lateral side of the package body 631. Such a package structure can improve heat sink efficiency and an electrical characteristic.

The lead electrodes 635 and 636 make contact with top surfaces of lead parts of the board 610, and the lead electrodes 635 and 636 may be mounted on the board 610 through an adhering scheme or a bonding scheme.

Figure 14:
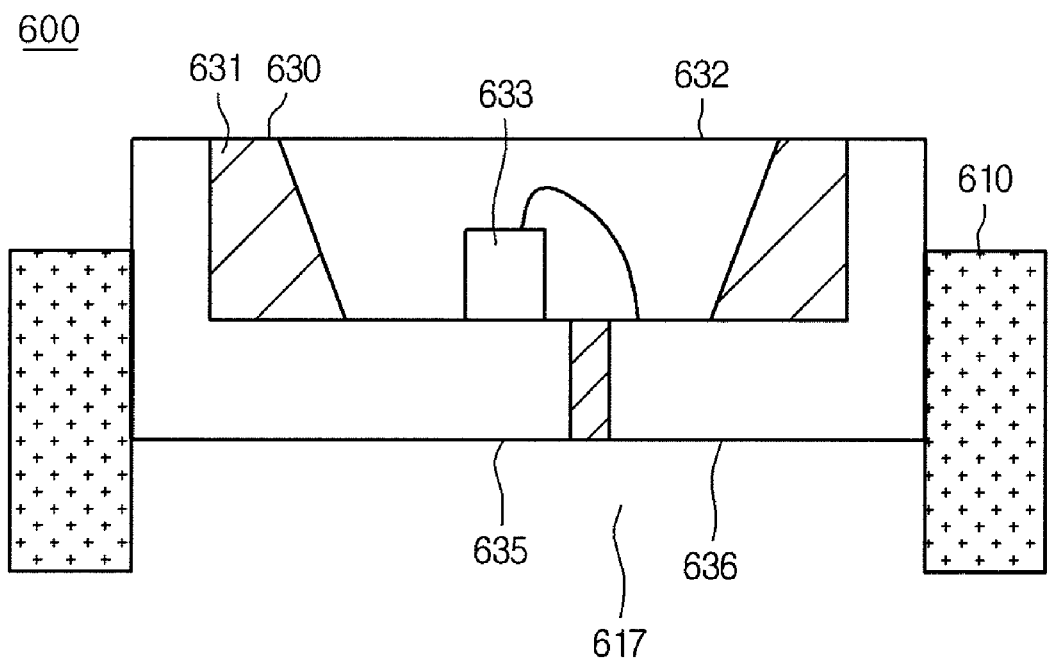

FIG. 14 is a view showing a modified example of the light emitting module of FIG. 13. The receiving groove 617 of the board 610 of the light emitting module 600 is formed, and the supporting part 615 is removed from the outer portion of the receiving groove 617. Accordingly, the light emitting device 630 is inserted into the receiving groove 617 and coupled with the receiving groove 617 through a sliding scheme. An electrical connection of the light emitting device 630 is achieved through the board 610 or another connection board under the board 610. A heat sink structure may be provided under the board 610.

Figure 15:
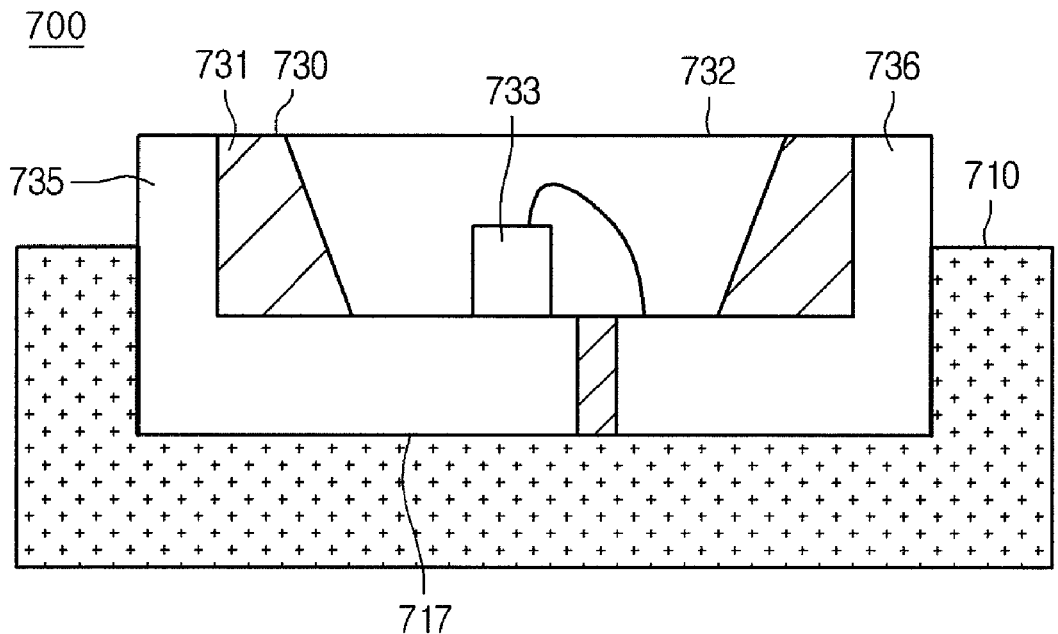

Referring to FIG. 15, a light emitting module is provided on a board 710 thereof with a plurality of light emitting devices 730. A receiving groove 717 of the board 710 is recessed to support a lower portion of the light emitting device 730.

Lead electrodes 735 and 736 of the light emitting device 730 are electrically connected to a light emitting diode 733 provided in a cavity 732 of a package body 731, and form a lower portion of the package body 731.

The lead electrodes 735 and 736 electrically make contact with lead parts of the board 710, and the lead electrodes 735 and 736 may be mounted on the board 710 by using an adhesive or a solder.

The embodiments are not limited to the above light emitting modules, and various modifications and combinations are possible in the technical scope of the embodiments. The light emitting modules may be used as a light source in an illumination device, an indication device, or a display device.

The light emitting device according to the embodiment may have a side view type or a top view type, and may be adapted in an illumination device and a light source (e.g., front light, backlight) for products including a portable terminal, a portable computer, and a broadcasting device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments may be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting module, comprising:
 a plurality of light emitting devices, each light emitting device including a package body, a light emitting diode provided in the package body, and a plurality of lead electrodes electrically connected to the light emitting diode while protruding outwardly from the package body; and
 a board including at least one receiving groove that at least one of the light emitting devices is removably inserted into,
 wherein the at least one receiving groove includes:
 a body groove into which the package body of the each light emitting device is inserted;
 a plurality of holders having convex sections protruding toward the body groove at both sides of the at least one receiving groove; and
 a plurality of coupling parts having a concave section between the plurality of holders, the plurality of coupling parts being coupled with the plurality of lead electrodes of the each light emitting device.

2. The light emitting module of claim 1, wherein at least a portion of the package body of the light emitting device is received in the at least one receiving groove.

3. The light emitting module of claim 1, wherein the plurality of lead electrodes is electrically connected to the board in the at least one receiving groove.

4. The light emitting module of claim 1, wherein the plurality of holders and the plurality of coupling parts alternate with each other.

5. The light emitting module of claim 4, wherein the plurality of holders and the plurality of coupling parts are formed in an irregular interval.

6. The light emitting module of claim 1, wherein the plurality of lead electrodes of the light emitting device are formed on at least one of a side surface and a bottom surface of the package body.

7. The light emitting module of claim 4, wherein, when a width of the each light emitting device is one period, at least one coupling part is provided on the board in the one period.

8. The light emitting module of claim 7, wherein the plurality of holders are provided in the one period.

9. The light emitting module of claim 1, wherein the board is provided therein with a plurality of receiving grooves in an array direction of the light emitting device, and an intermediate supporting part is formed between the plurality of receiving grooves.

10. The light emitting module of claim 7, wherein at least three neighboring light emitting devices are arrayed in identical intervals.

11. The light emitting module of claim 7, wherein the light emitting devices are arrayed in random intervals.

12. The light emitting module of claim 9, wherein the plurality of light emitting devices are arrayed in the plurality of receiving grooves in identical intervals.

13. The light emitting module of claim 1, further comprising a plurality of lead parts provided in at least one of the board and the at least one receiving groove, the plurality of lead parts making contact with the plurality of lead electrodes of the light emitting device.

14. The light emitting module of claim 1, wherein the at least one receiving groove has a shape of a hole or a recess formed in an array direction of the plurality of light emitting devices.

15. A light unit, comprising:
 a plurality of light emitting devices, each light emitting device including a package body, a light emitting diode provided in the package body, and a plurality of lead electrodes electrically connected to the light emitting diode while protruding outwardly from the package body;
 a board including at least one receiving groove that at least one of the light emitting devices is removably inserted into; and
 an optical member provided at one side of the plurality of light emitting devices,
 wherein the at least one receiving groove includes:
 a body groove into which the package body of the each light emitting device is inserted;

a plurality of holders having convex sections protruding toward the body groove at both sides of the at least one receiving groove; and a plurality of coupling parts having a concave section between the plurality of holders, the plurality of coupling parts being coupled with the plurality of lead electrodes of the each light emitting device.

16. The light unit of claim 15, further comprising:

a first lead part provided at one side of the at least one receiving groove of the board; and a second lead part provided at an opposite side of the receiving groove of the board.

17. The light unit of claim 15, wherein the optical member includes at least one of a light guide plate and an optical sheet.

18. The light unit of claim 15, wherein at least a portion of the package body of the each light emitting device is received in the at least one receiving groove.

19. The light unit of claim 15, wherein the plurality of lead electrodes is electrically connected to the board in the at least one receiving groove.

20. The light unit of claim 15, wherein the plurality of holders and the plurality of coupling parts alternate with each other.

21. The light unit of claim of 20, wherein the plurality of holders and the plurality of coupling parts are formed in irregular intervals.

22. The light unit of claim of 15, wherein the plurality of lead electrodes of the light emitting device are formed on at least one of a side surface and a bottom surface of the package body.

23. The light unit of claim of 15, wherein, when a width of the each light emitting device is one period, at least one coupling part is provided on the board in the one period.

24. The light unit of claim of 23, wherein the plurality of holders are provided in the one period.

25. The light unit of claim of 15, wherein the board is provided therein with a plurality of receiving grooves in an array direction of the light emitting device, and an intermediate supporting part is formed between the plurality of receiving grooves.

* * * * *